(12) United States Patent
Ishii

(10) Patent No.: US 10,075,089 B2
(45) Date of Patent: Sep. 11, 2018

(54) POWER CONVERSION DEVICE

(71) Applicant: Kabushiki Kaisha Toshiba, Minato-ku (JP)

(72) Inventor: Hiroshi Ishii, Kawasaki (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/459,168

(22) Filed: Mar. 15, 2017

(65) Prior Publication Data
US 2017/0250619 A1    Aug. 31, 2017

Related U.S. Application Data

(63) Continuation of application No. PCT/JP2015/066629, filed on Jun. 9, 2015.

(30) Foreign Application Priority Data

Sep. 18, 2014   (JP) ................................ 2014-190295

(51) Int. Cl.
*H05K 7/02*    (2006.01)
*H05K 7/04*    (2006.01)
(Continued)

(52) U.S. Cl.
CPC ........... *H02M 7/003* (2013.01); *H02M 1/084* (2013.01); *H02M 5/458* (2013.01);
(Continued)

(58) Field of Classification Search
CPC ...... H02M 7/003; H02M 1/084; H02M 5/458; H02M 2001/0009; H05K 5/0017; H05K 5/0226; H02P 27/06
(Continued)

(56) References Cited

U.S. PATENT DOCUMENTS 8,686,601 B2 * 4/2014 Michinaka ............ H01L 25/162
                                                        307/10.1
8,929,097 B2 * 1/2015 Nakasaka ............ H01L 23/473
                                                        361/688
(Continued)

FOREIGN PATENT DOCUMENTS

EP       2 264 883 A2    12/2010
JP       2001-274566     10/2001
(Continued)

OTHER PUBLICATIONS

International Search Report dated Sep. 15, 2015 in PCT/JP2015/066629, filed on Jun. 9, 2015.

*Primary Examiner* — Hung S Bui
(74) *Attorney, Agent, or Firm* — Oblon, McClelland, Maier & Neustadt, L.L.P.

(57) ABSTRACT

A power-conversion device includes a power-converter converting power from the power-supply. A filter-capacitor part eliminates noise from power in the power-converter. A housing contains a power unit comprising the filter-capacitor part and the power-converter stacked on the filter-capacitor part and to enable the power unit to be taken in and out from an upper surface and a side surface thereof. A guide rail is located on a bottom surface of the housing to extend in a direction substantially perpendicular to the side surface and guides the power unit when the power unit is taken in and out from the side surface of the housing. A protrusion is located on the filter-capacitor part to fit upward into a hole or a concave portion formed on the power-converter and guides the power-converter when the power-converter is taken in and out from the upper surface of the housing.

6 Claims, 12 Drawing Sheets

(51) Int. Cl.
 *H02M 7/00* (2006.01)
 *H02M 5/458* (2006.01)
 *H02M 1/084* (2006.01)
 *H05K 5/02* (2006.01)
 *H05K 5/00* (2006.01)
 *H02M 1/00* (2006.01)
 *H02P 27/06* (2006.01)

(52) U.S. Cl.
 CPC ......... *H05K 5/0017* (2013.01); *H05K 5/0226* (2013.01); *H02M 2001/0009* (2013.01); *H02P 27/06* (2013.01)

(58) Field of Classification Search
 USPC .................................... 361/807, 809, 810
 See application file for complete search history.

(56) References Cited

U.S. PATENT DOCUMENTS

| | | | |
|---|---|---|---|
| 2001/0032416 A1 | 10/2001 | Matsumoto et al. | |
| 2015/0380147 A1* | 12/2015 | Takano | H02M 1/126 333/185 |

FOREIGN PATENT DOCUMENTS

| | | |
|---|---|---|
| JP | 2003-23778 | 1/2003 |
| JP | 2010-110129 | 5/2010 |
| JP | 2010-284049 | 12/2010 |
| JP | 2011-253919 | 12/2011 |
| JP | 2012-256740 A | 12/2012 |
| JP | 2014-33587 | 2/2014 |

* cited by examiner

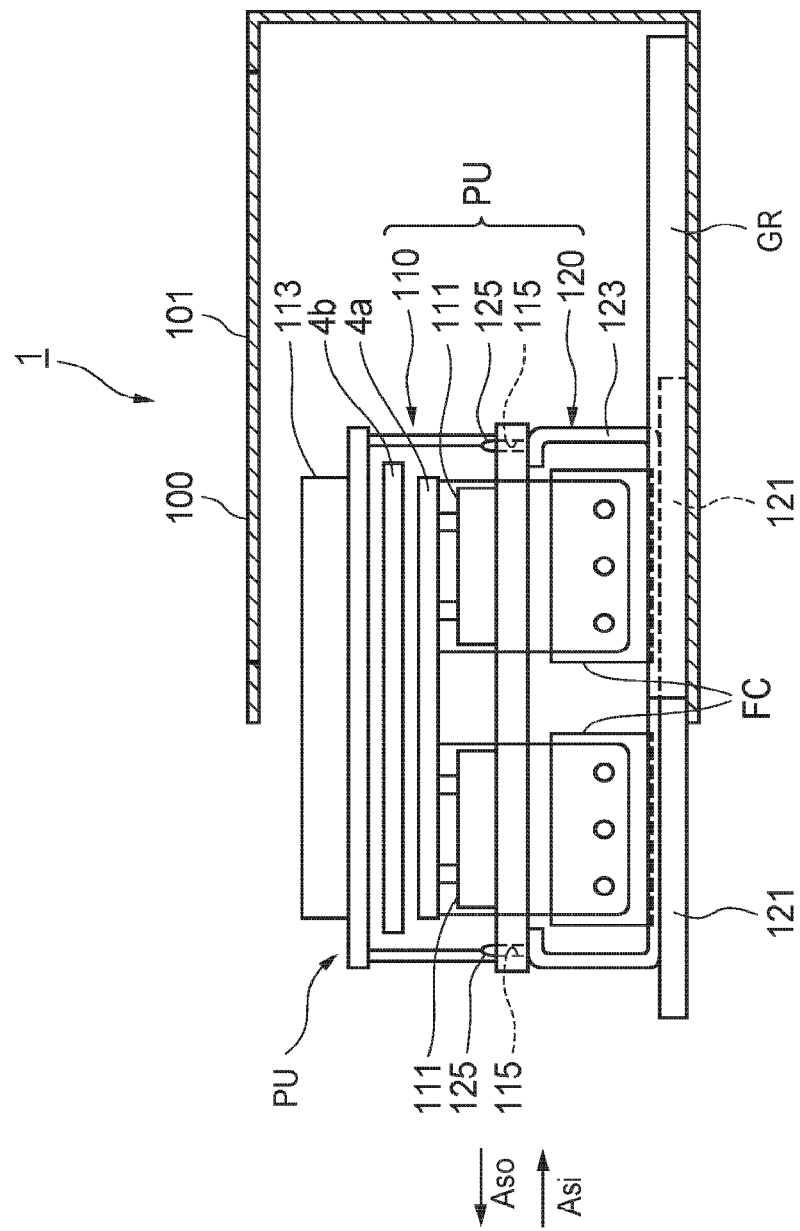

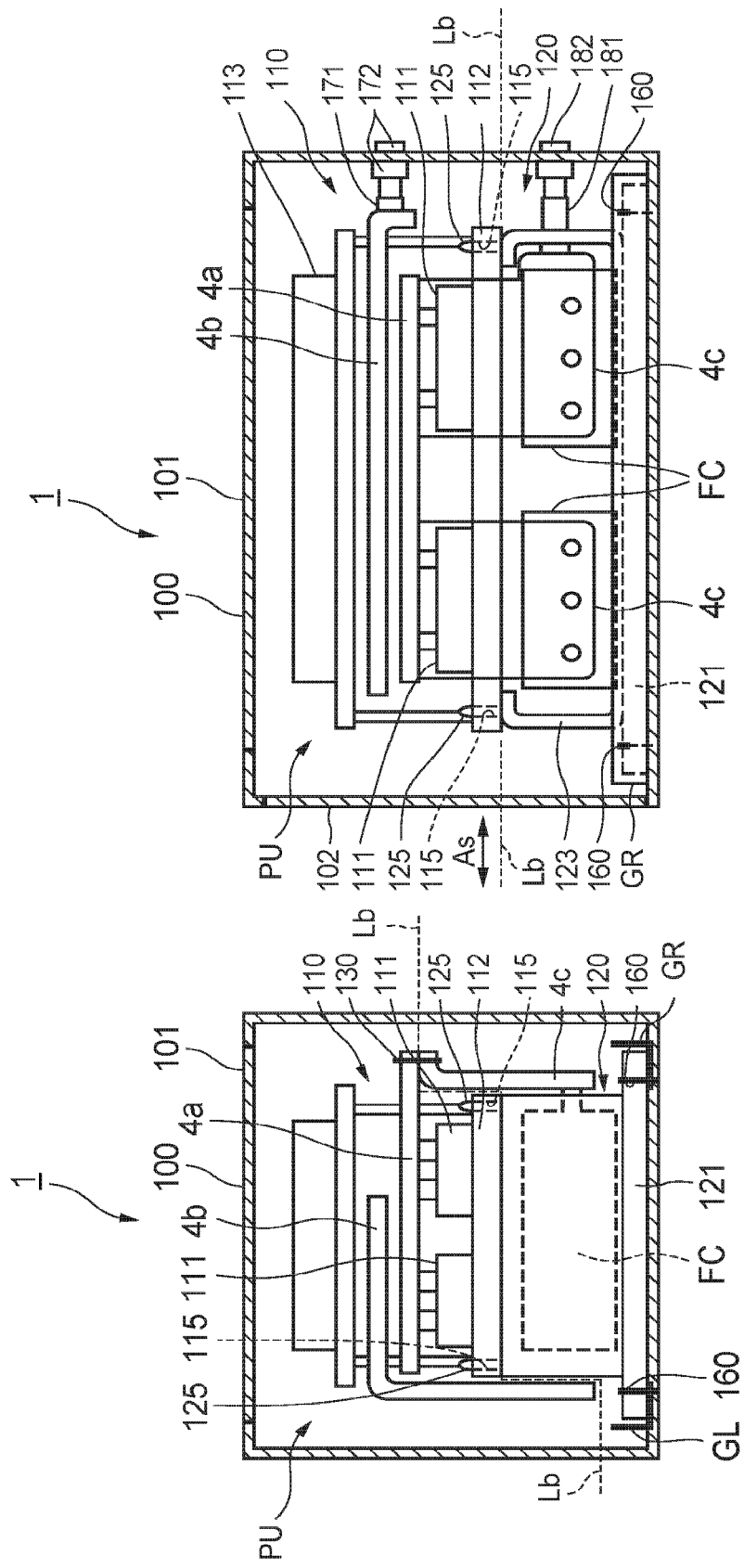

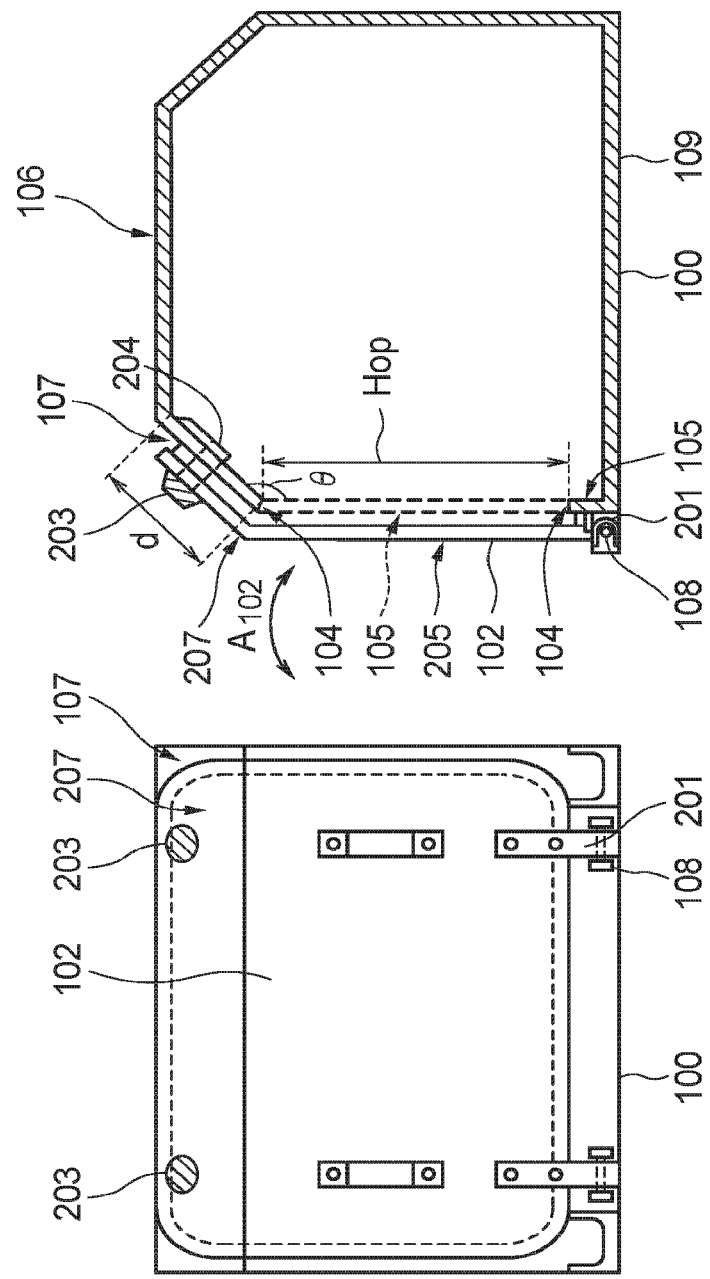

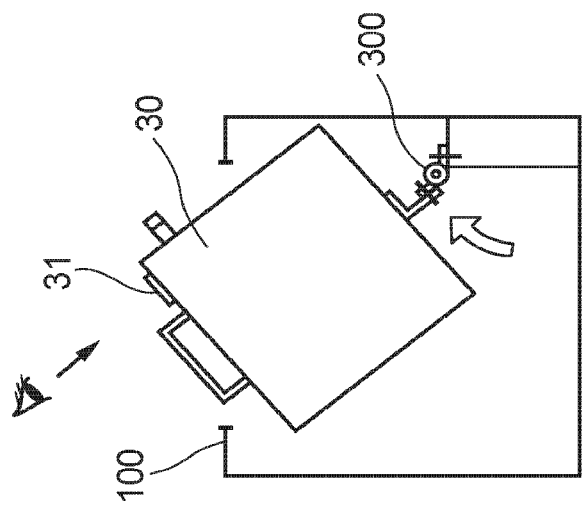
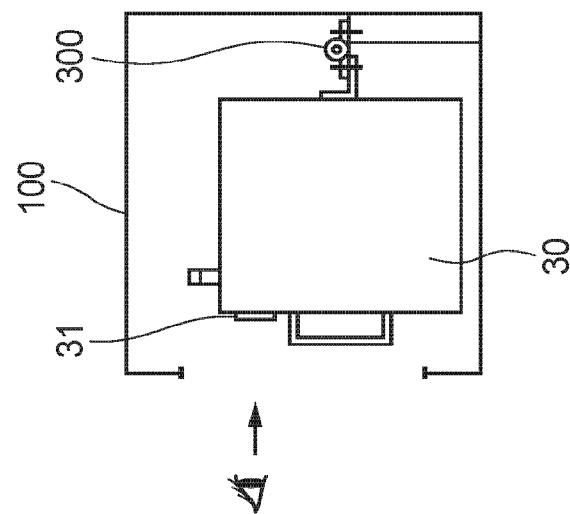
FIG.10A
FIG.10B

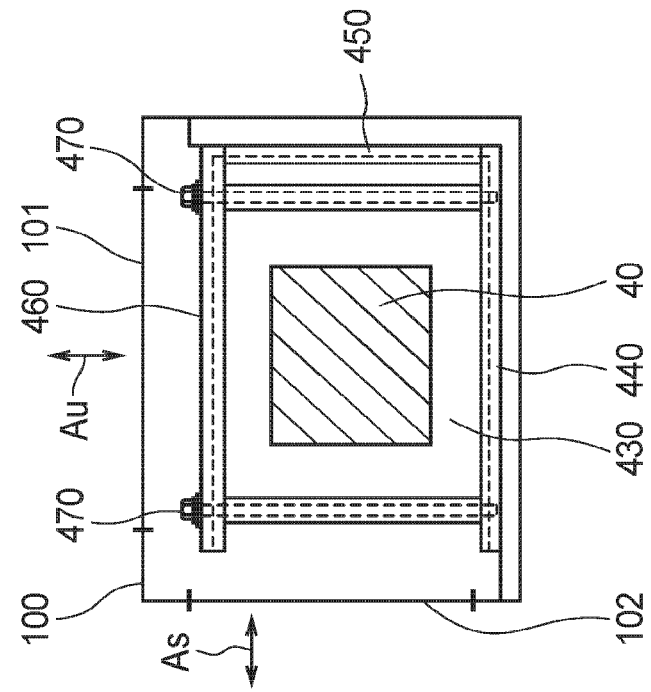
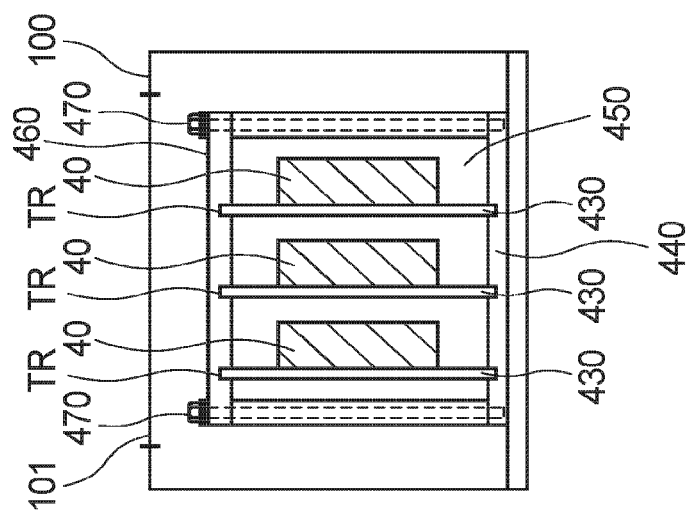
FIG. 12A
FIG. 12B

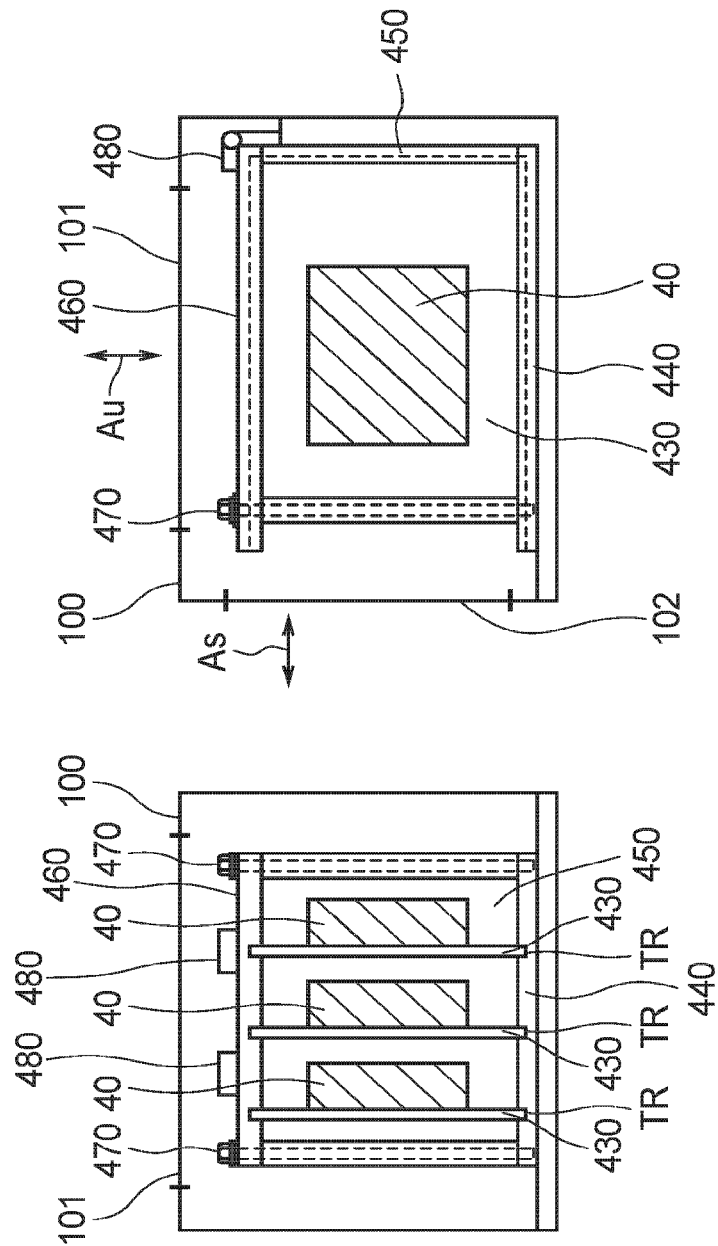

POWER CONVERSION DEVICE

CROSS REFERENCE TO RELATED APPLICATIONS

This application is based upon and claims the benefit of priority from the prior Japanese Patent Application No. 2014-190295, filed on Sep. 18, 2014, the entire contents of which are incorporated herein by reference.

FIELD

The embodiments of the present invention relate to a power conversion device.

BACKGROUND

A power conversion device has conventionally been used to operate a drive system such as a main electric motor (a motor) of an electric rolling stock. The power conversion device converts power of an overhead wire to power required by the drive system in order to rotate wheels of an electric rolling stock.

Such a power conversion device is generally placed under the floor of a vehicle of an electric rolling stock or on the roof thereof. When a power conversion device is placed under the floor of a vehicle, the power conversion device is attached so as to be hung on a vehicle body beam under the floor of the vehicle.

For this purpose, the power conversion device is designed to have an attachment portion on an upper surface thereof and an inspection door (an inspection cover) on a side surface thereof. When an inner portion of the power conversion device is to be accessed, an operator opens the inspection door provided on the side surface of the power conversion device.

Meanwhile, when a power conversion device is placed on the roof of a vehicle, the power conversion device is placed on a vehicle body beam on the roof of the vehicle. For this purpose, the power conversion device is designed to have an attachment portion on a bottom surface thereof and an inspection door on an upper surface thereof. When an inner portion of the power conversion device is to be accessed, an operator opens the inspection door provided on the upper surface of the power conversion device.

As described above, the position of the inspection door provided on a power conversion device differs according to the placement position of the power conversion device in a vehicle. Therefore, an internal configuration of the power conversion device and devices housed in the power conversion device need to be changed in the design depending on the placement position of the power conversion device in a vehicle.

BRIEF DESCRIPTION OF THE DRAWINGS

FIG. 3 is a diagram illustrating a manner of pulling out a power unit PU from a side door 102 of a housing 100;

FIGS. 5A-5B are a front view and a side view respectively illustrating an example of a configuration of the power conversion device 1 according to a modification of the first embodiment;

FIGS. 6A-6B are a front view and a side view respectively illustrating an example of a configuration of the housing 100 of the power conversion device 1 according to a second embodiment;

FIGS. 10A-10B are diagrams illustrating an example of a configuration of the power conversion device 1 according to a third embodiment;

FIGS. 12A-12B are a front view and a side view respectively illustrating an example of a configuration of the power conversion device 1 according to a fourth embodiment; and FIGS. 13A-13B are a front view and a side view respectively illustrating an example of a configuration of the power conversion device 1 according to a modification of the fourth embodiment.

DETAILED DESCRIPTION

A power conversion device according to an embodiment is a power conversion device that converts power from a power supply and supplies converted power to a load. A power converter converts power from the power supply. A filter capacitor part eliminates noise from power in the power converter. A housing is configured to house therein a power unit comprising the filter capacitor part and the power converter stacked on the filter capacitor part and to enable the power unit to be taken in and out from an upper surface and a side surface thereof. A guide rail is located on a bottom surface of the housing to extend in a direction substantially perpendicular to the side surface and guides the power unit when the power unit is taken in and out from the side surface of the housing. A protrusion is located on the filter capacitor part to fit upward into a hole or a concave portion formed on the power converter and guides the power converter when the power converter is taken in and out from the upper surface of the housing.

Embodiments of the present invention will be described below in detail with reference to the accompanying drawings. These embodiments do not limit the present invention.

First Embodiment

Figure 1:
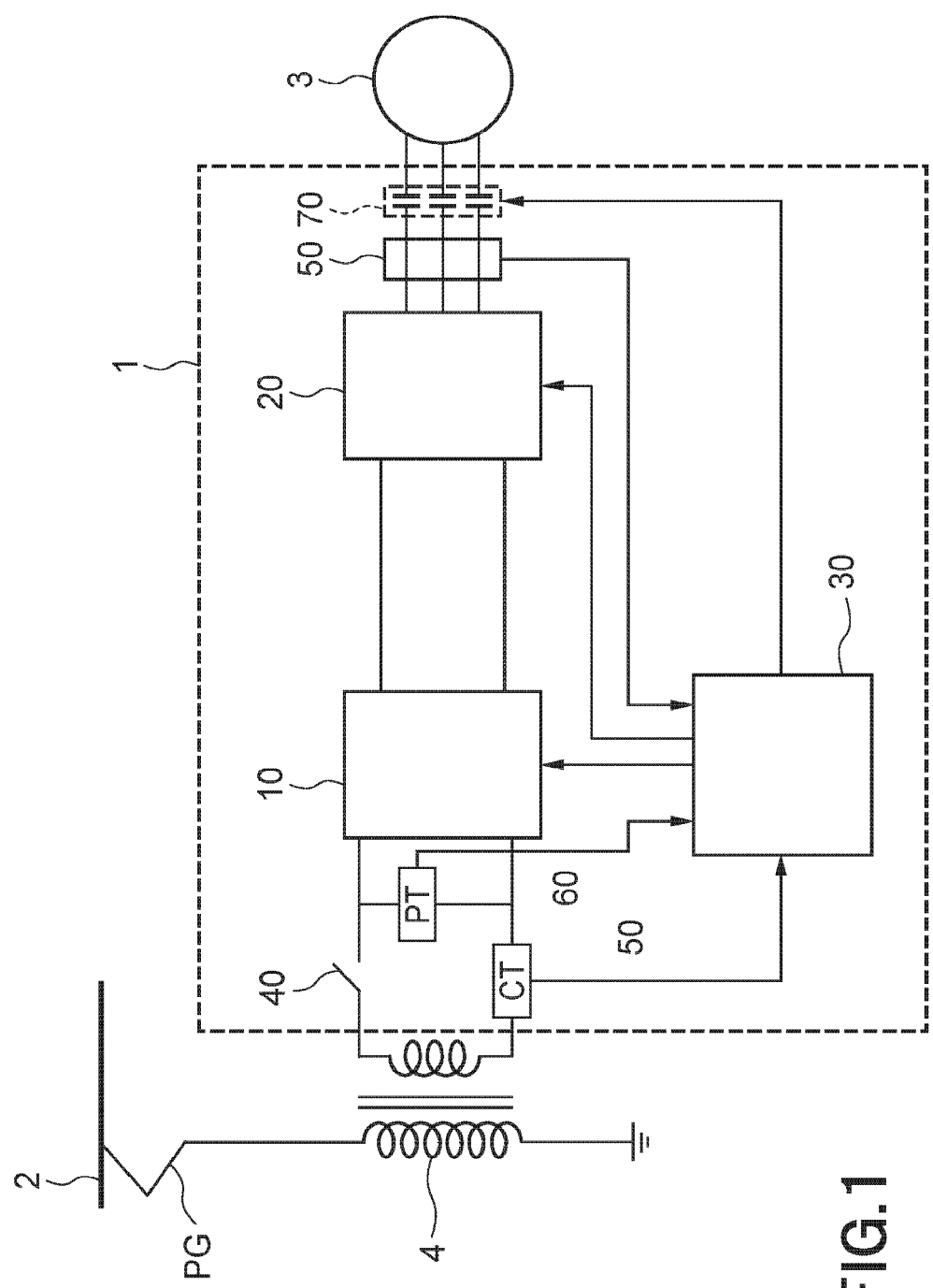
FIG. 1 is a block diagram illustrating an example of a configuration of a power conversion device 1 and other elements according to a first embodiment.

FIG. 1 is a block diagram illustrating an example of a configuration of a power conversion device 1 and other elements according to a first embodiment. The power conversion device 1 is a device used for power control on vehicles of an electric rolling stock such as a railroad vehicle and is placed under the floor of a vehicle or the roof thereof.

A pantograph PG is brought to electric contact with an overhead wire 2 serving as a power source and supplies power from the overhead wire to the power conversion device 1 or supplies regenerated power to the overhead wire 2. The power from the pantograph PG is supplied to the power conversion device 1 via a transformer 4. The power conversion device 1 converts power from the transformer 4 and supplies converted power to a motor 3.

The motor 3 drives wheels of the electric rolling stock in order to run the electric rolling stock. The motor 3 is, for example, a three-phase AC motor and is a permanent-magnet synchronous motor (PMSM) using a ferromagnet such as a neodymium magnet.

The power conversion device 1 includes a converter 10, an inverter 20, a controller 30, a circuit breaker 40, a current detector 50, a voltage detector 60, and a contactor 70.

The converter 10 converts AC power from the overhead wire 2 to DC power. The inverter 20 converts the DC power from the converter 10 to AC power (three-phase AC power, for example). The AC power obtained by conversion of the inverter 20 is supplied to the motor 3 via the contactor 70. The converter 10 and the inverter 20 have a plurality of gates (for example, semiconductor elements such as an IGBT or a GTO) and control switching of these gates to convert AC power to DC power or convert DC power to AC power. The AC power obtained by conversion of the inverter 20 is supplied to an electric motor.

Each of the converter 10 and the inverter 20 includes a filter capacitor part 120 (see FIG. 2) and suppresses transitional changes in power with the filter capacitor part 120.

The contactor 70 is an electromagnetic switchgear that electrically connects or disconnects the motor 3 and the inverter 20. For example, the contactor 70 can be a motor cut-out contactor (MCOK).

The controller 30 receives a motor current value from the current detector 50, a voltage value from the voltage detector 60, and signals such as a control signal, and controls switching of a gate of the inverter 20 and connection/disconnection of the contactor 70 based on these values and signals.

The current detector 50 detects a current flowing between the transformer 4 and the converter 10. The voltage detector 60 detects a voltage input to the converter 10.

The circuit breaker 40 includes a main power-supply switch, a high-speed circuit breaker that interrupts power when a major failure occurs, a circuit breaker that interrupts power when a notch is brought to an off-state, and the like.

The above configuration indicates a case where the power supplied via the pantograph PG is AC power. However, the supplied power can be DC power. In this case, the power conversion device has a configuration including no converter.

The motor is cited as an example of a load to which the power conversion device supplies power. However, the load is not limited thereto. The power conversion device can be an auxiliary power-supply device (an inverter) and a load to which power is supplied can be an air conditioner, an illumination, or the like provided in a vehicle.

Figures 2A, 2B:
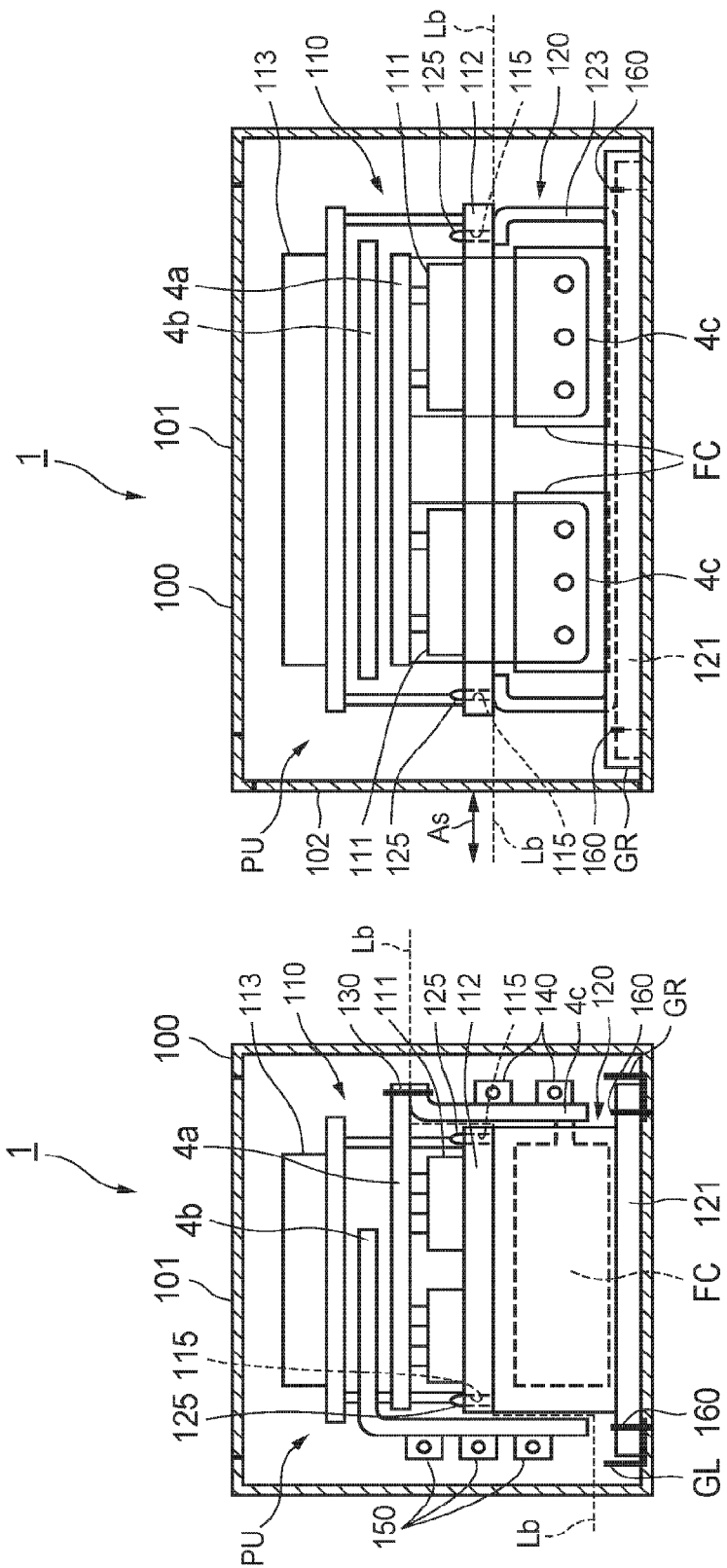
FIGS. 2A-2B are a front view and a side view respectively illustrating an example of the configuration of the power conversion device 1 according to the first embodiment.

FIG. 2(A) is a front view illustrating an example of the configuration of the power conversion device 1 according to the first embodiment. FIG. 2(B) is a side view illustrating the example of the configuration of the power conversion device 1 according to the first embodiment. In FIGS. 2(A) and 2(B), illustrations of a side wall (a side door) or a front wall of a housing 100 are omitted to show a configuration of a power unit PU housed in the power conversion device 1.

The housing 100 is configured to house the power unit PU therein and to enable the power unit PU to be taken in and out from an upper surface and a side surface thereof. For example, the housing 100 includes an upper door 101 provided on the upper surface and a side door 102 provided on the side surface. When the power conversion device 1 is placed on the roof of a vehicle, the upper door 101 is opened to enable the power unit PU to be taken in and out from an upper surface side of the housing 100. Meanwhile, when the power conversion device 1 is placed under the floor of a vehicle, the side door 102 is opened to enable the power unit PU to be taken in and out from a side surface side of the housing 100.

The power unit PU includes a power converter 110 and the filter capacitor part 120. An upper portion than a broken line Lb in FIGS. 2(A) and 2(B) indicates the power converter 110 and a portion thereunder indicates the filter capacitor part 120.

The power converter 110 includes power converting elements (for example, semiconductor elements such as an IGBT or a GTO) 111 constituting the converter 10, the inverter 20, and the like illustrated in FIG. 1, a cooling fin or a support substrate 112, a control substrate 113 that controls the power converting elements 111, and conductors 4a and 4b electrically connected to the power converting elements 111 or the control substrate 113.

The power converter 110 has holes or concave portions 115 (hereinafter, "holes 115") on the cooling fin or the support substrate 112, which fit to protrusions 125 provided on a protection case 123 of the filter capacitor part 120 described later, and is placed on the filter capacitor part 120 in such a manner that the protrusions 125 fit into the holes 115. Accordingly, the power converter 110 is not displaced in a parallel direction (horizontal direction) to an upper surface of the filter capacitor part 120 when mounted on the filter capacitor part 120.

The filter capacitor part 120 includes a filter capacitor FC provided on a support substrate 121, the protection case 123 that protects the filter capacitor FC, and a conductor 4c electrically connected to the filter capacitor FC.

The protection case 123 has the protrusions 125 provided thereon. The protrusions 125 are provided to be inserted to the holes 115 formed on the power converter 110 (inserted upward), and are configured to guide the power converter 110 when the power converter 110 is taken in and out from the upper surface of the housing 100.

By mounting the power converter 110 on the filter capacitor part 120 in such a manner that the protrusions 125 fit into the holes 115, the power converter 110 and the filter capacitor part 120 are configured as one unit being the power unit PU. For example, when the power unit PU is pulled out from the side door 102 of the housing 100, the holes 115 of the power converter 110 catch the protrusions 125 of the filter capacitor part 120, whereby the power converter 110 is pulled out together with the filter capacitor part 120. At this time, the power unit PU is pulled out along a guide rail GR, which will be described later. Meanwhile, the power converter 110 is detachable from the filter capacitor part 120 and the power converter 110 can also be pulled out as a separate body from the filter capacitor part 120. For example, when the power converter 110 is taken out from the upper door 101 of the housing 100, the holes 115 of the power converter 110 come off the protrusions 125 of the filter capacitor part 120, whereby the power converter 110 is taken out as a separate body from the filter capacitor part 120.

When the power converter 110 is taken in from the upper door 101 of the housing 100, the holes 115 of the power converter 110 fit to the protrusions 125 of the filter capacitor part 120, whereby the position of the power converter 115 on the filter capacitor part 120 is determined. That is, the protrusions 125 and the holes 115 have also a function to determine the position of the power converter 110 on the filter capacitor part 120. While insertion of the protrusions 125 into the holes 115 suffices, the protrusions 125 can be screwed. In this case, when the power converter 110 is to be moved as a separated body from the filter capacitor part 120, screws are detached to enable the holes 115 to come off the protrusions 125.

The conductor 4a is electrically connected to a terminal of the power conversion elements 111. The conductor 4b is connected between the control substrate 113 and the power conversion elements 111. The conductor 4c is electrically connected to a terminal of the filter capacitor FC. The conductors 4a and 4c are coupled to each other with a connection part 130. The conductor 4c is electrically connected to other devices (not illustrated) in the housing 100 or outside the housing 100 with connection parts 140. The conductor 4b is electrically connected to other devices in the housing 100 or outside the housing 100 with connection parts 150.

The guide rail GR is fixed to a bottom surface of the housing 100. The guide rail GR is provided on the bottom surface of the housing 100 to extend in a substantially perpendicular direction to a side surface (the side door 102) of the housing 100 as illustrated in FIG. 2(B). The guide rail GR guides the power unit PU when the power unit PU is to be taken in and out from the side surface (the side door 102) of the housing 100. More specifically, when the power unit PU is to be moved in directions of an arrow As in FIG. 2(B), the power unit PU slidingly moves on the guide rail GR. At this time, to prevent the power unit PU from being displaced in a traverse direction to the moving directions, the guide rail GR is in contact with a side surface of the support substrate 121 of the power unit PU to suppress displacement of the power unit PU in the traverse direction.

Also when the power unit PU is to be taken in from the side door 102 of the housing 100, the guide rail GR guides the power unit PU. Therefore, the guide rail GR has also a function to determine the position of the power unit PU in the housing 100.

The power unit PU is fixed to the housing 100 with fasteners 160. Therefore, when the entire power unit PU is to be moved, the fasteners 160 need to be detached. When there is a member that connects the power unit PU and the housing 100, this member is also detached. For example, in a case where the connection parts 140 and 150 are screwed on the housing 100, the connection parts 140 and 150 need to be detached from the housing 100 when the power unit PU is to be moved.

When only the power converter 110 in the power unit PU is to be moved, a part coupling the power converter 110 and the filter capacitor part 120 needs to be detached. For example, when the holes 115 are screwed on the protrusions 125, screws that couple the holes 115 and the protrusions 125 also need to be detached. When the connection part 130 is screwed, the connection part 130 needs to be detached to enable the conductor 4a and the conductor 4c to be separated from each other.

FIG. 3 is a diagram illustrating a manner of pulling out the power unit PU from the side door 102 of the housing 100. As described above, when the power unit PU is pulled out of the housing 100, the members (such as the connection parts 140 and 150 and the fasteners 160) that connect the power unit PU and the housing 100 are detached in advance.

When the power unit PU is to be pulled out from the side door 102 of the housing 100, the side door 102 is opened. The entire power unit PU is then pulled out along the guide rail GR in a direction of an arrow Aso. At this time, the protrusions 125 of the filter capacitor part 120 are in a state fitted in the holes 115 of the power converter 110 in a perpendicular direction to the direction Aso. Accordingly, whether the power converter 110 or the filter capacitor part 120 is pulled out, the entire power unit PU is integrally pulled out along the guide rail GR.

Conversely, when the power unit PU is taken in from the side door 102 of the housing 100, the side door 102 is opened and the entire power unit PU is inserted in a direction of an arrow Asi along the guide rail GR. At this time, the protrusions 125 of the filter capacitor part 120 are in a state fitted in the holes 115 of the power converter 110 in a perpendicular direction to the direction Asi. Therefore, whether the power converter 110 or the filter capacitor part 120 is pushed, the entire power unit PU is integrally inserted along the guide rail GR.

Figure 4:
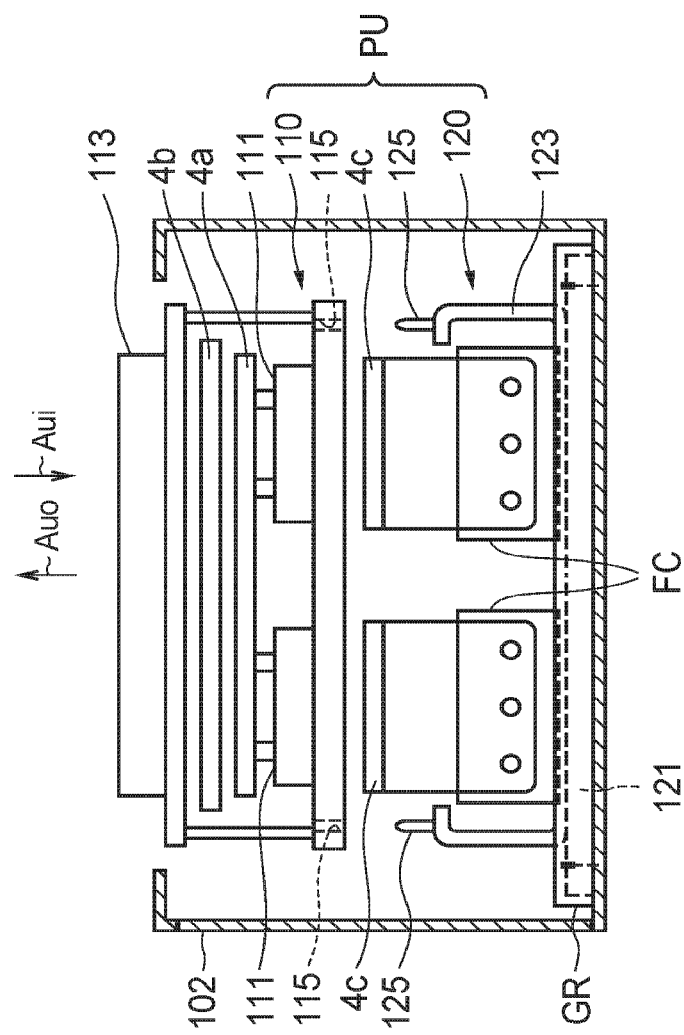
FIG. 4 is a diagram illustrating a manner of taking out a power converter 110 from the upper door 101 of the housing 100.

FIG. 4 is a diagram illustrating a manner of taking out the power converter 110 from the upper door 101 of the housing 100. As described above, when the power converter 110 is to be pulled out of the housing 100, the members that connect the power converter 110 and the housing 100 and the members that connect the power converter 110 and the filter capacitor part 120 are detached in advance.

When the power converter 110 is to be taken out from the upper door 101 of the housing 100, the upper door 101 is opened. The power converter 110 is then lifted in a direction of an arrow Auo. At this time, the protrusions 125 of the filter capacitor part 120 are in a state fitted in the holes 115 of the power converter 110 in a parallel direction to the direction Auo. Therefore, when the power converter 110 is lifted in the direction Auo, the power converter 110 is separated from the filter capacitor part 120 and only the power converter 110 can be taken out of the housing 100. It is needless to mention that the filter capacitor part 120 can be thereafter taken out from the upper door 101 of the housing 100.

Conversely, when the power convertor 110 is taken in from the upper door 101 of the housing 100, the upper door 101 is opened and the power converter 110 is inserted in a direction of an arrow Aui. The power converter 110 is then mounted on the filter capacitor part 120. At this time, when the holes 115 of the power converter 110 fit to the protrusions 125 of the filter capacitor part 120, the protrusions 125 then guide the power converter 110. Accordingly, the position of the power converter 110 on the filter capacitor part 120 is determined.

In this way, the power conversion device 1 according to the present embodiment enables the entire power unit PU to be taken in and out through the side door 102 of the housing 100 and also enables the power converter 110 and the filter capacitor part 120 to be taken in and out separately through the upper door 101 of the housing 100. Accordingly, when the power conversion device 1 is installed under the floor of a vehicle, an operator can open the side door 102 of the housing 100 and take the power unit PU in and out therefrom. On the other hand, when the power conversion device 1 is installed on the roof of a vehicle, an operator can open the upper door 101 of the housing 100 and take the power unit PU in and out therefrom. Therefore, the power conversion device 1 according to the present embodiment can be designed in the same configuration regardless of the placement position in a vehicle of an electric rolling stock and can facilitate an access to an inner portion of the housing 100.

Generally, the power converter 110 and the filter capacitor part 120 each have a weight of several tens of kilograms and the entire weight of the power unit PU is considerably large. Therefore, when the power unit PU is to be inserted into the housing 100 or the power unit PU is to be taken out of the housing 100, it is difficult to lift the entire power unit PU with hands while the power unit PU can be slid with hands along the guide rail GR. For example, when the power conversion device 1 is placed under the floor of a vehicle, the power unit PU can be pulled out from the side door 102 of the housing 100. However, when the power conversion device 1 is placed on the roof, the power unit PU needs to be lifted above the roof and the work efficiency is deteriorated. It is also conceivable that the filter capacitor part 120 and the power converter 110 are placed at different positions. However, in this case, the distance between the filter capacitor part 120 and the power converter 110 becomes large and inductance between the filter capacitor part 120 and the power converter 110 is increased. This causes a problem such as a reduction in interrupt performance of semiconductor elements.

In contrast thereto, in the present embodiment, the power converter 110 and the filter capacitor part 120 are used as the power unit PU being one unit during the use, and the power converter 110 and the filter capacitor part 120 can be separated from each other and be taken out individually when the power unit PU is to be taken in and out from the upper door 101 of the housing 100 at the time of maintenance or the like.

This enables the power unit PU to be taken in and out from the upper door 101 of the housing 100 relatively easily. Furthermore, when the power unit PU is to be taken in and out from the side door 102 of the housing 100, the power unit PU is entirely pulled out with the holes 115 of the power converter 110 being fitted to the protrusions 125 of the filter capacitor part 120. In this case, as described above, the power unit PU is relatively easily taken in and out. In this manner, the power conversion device 1 according to the present embodiment can be designed in the same configuration regardless of the placement position in a vehicle of an electric rolling stock. Furthermore, the power conversion device 1 according to the present embodiment can facilitate an access to an inner portion of the housing 100 and enables an efficient work.

(Modification)

FIG. 5(A) is a front view illustrating an example of a configuration of the power conversion device 1 according to a modification of the first embodiment. FIG. 5(B) is a side view illustrating the example of the configuration of the power conversion device 1 according the modification of the first embodiment. The power conversion device 1 according to the modification further includes first connectors 171 and 181 provided on the power unit PU, and second connectors 172 and 182 provided on the housing 100. The first connector 171 is provided on the conductor 4b of the power converter 110 and the first connector 181 is provided on the conductor 4c of the filter capacitor part 120. The second connectors 172 and 182 are provided on a facing surface that faces the side door 102 of the housing 100 and are configured to be electrically connectable to an external device of the housing 100.

The first connector 171 couples to the second connector 172 to electrically connect the conductor 4b to the second connector 172. The first connector 181 couples to the second connector 182 to electrically connect the conductor 4c to the second connector 182. Coupling between the first connector 171 and the second connector 172, and coupling between the first connector 181 and the second connector 182 can be arbitrary coupling and can be, for example, male-female coupling. However, it is preferable that the coupling between the first connector 171 and the second connector 172 and the coupling between the first connector 181 and the second connector 182 be coupling that is attachable or detachable associated with movement of the power unit PU and be not coupling requiring a tool such as screwing.

The first connector 171 and the second connector 172 are provided at corresponding positions on the power unit PU and the housing 100, respectively, so as to be brought to contact and coupled to each other when the power unit PU is inserted along the guide rail GR. The first connector 181 and the second connector 182 are also provided at corresponding positions on the power unit PU and the housing 100, respectively, so as to be brought to contact and coupled to each other when the power unit PU is inserted along the guide rail GR.

After the power unit PU is inserted to the housing 100, the fasteners 160 serving as fixing parts can attach the power unit PU to the housing 100 while the contact between the first connectors 171 and 181 and the second connectors 172 and 182 is kept.

In the present modification, provision of the first connectors 171 and 181 and the second connectors 172 and 182 eliminates the need of the connection parts 140 and 150 illustrated in FIG. 2(A). Accordingly, it is unnecessary to screw the connection parts 140 and 150 when the power unit PU is taken in the housing 100 or detach the connection parts 140 and 150 when the power unit PU is taken out of the housing 100. In this case, a space in which a tool is inserted for working in the housing 100 can be omitted and the size of the power conversion device 1 can be reduced.

Other configurations of the present modification can be identical to those of the first embodiment. Therefore, the present modification can also obtain effects of the first embodiment.

Second Embodiment

FIG. 6(A) is a front view illustrating an example of a configuration of the housing 100 of the power conversion device 1 according to a second embodiment. FIG. 6(B) is a side sectional view illustrating the example of the configuration of the housing 100 of the power conversion device 1 according to the second embodiment. In FIGS. 6(A) and 6(B), the side door 102 of the housing 100 is illustrated and illustrations of the upper door 101 are omitted.

The housing 100 of the power conversion device 1 according to the second embodiment has an opening 104 on a side part 105 thereof and includes the side door 102 to close the opening 104.

The housing 100 includes an inclined part 107 provided at a boundary between the side part 105 and an upper part 106 of the housing 100. The inclined part 107 is inclined with respect to the side part 105 and the upper part 106 and is provided at a corner between the side part 105 and the upper part 106. The inclined part 107 is inclined at an angle θ ($90°<θ<180°$) with respect to the side part 105.

The side door 102 includes hooks 201 that are hung on engagement parts 108 provided on a lower portion of the side part 105 of the housing 100, and clamps 203 provided on the inclined part 107 of the housing 100. The side door 102 has an inclined part 207 inclined to correspond to the inclined part 107 of the housing 100. The inclined part 207 is provided on the top of a side part 205 of the side door 102 and is inclined with respect to the side part 205 at an angle substantially equal to the angle θ formed by the inclined part 107 and the side part 105 described above.

In this manner, the side part 205 of the side door 102 closes the opening 104 of the side part 105 of the housing 100 and the inclined part 207 of the side door 102 is in close contact along the inclined part 107 of the housing 100.

The hooks 201 are hung on the engagement parts 108 and are configured to enable the side door 102 to be rotated on the engagement parts 108 serving as pivot points (centers) in directions indicated by an arrow A102. Accordingly, the side door 102 can open the opening 104 of the housing 100 or close the opening 104. When the hooks 201 are detached from the engagement parts 108, the side door 102 itself can be detached from the housing 100.

The clamps 203 are provided on the inclined part 207 and have clicks 204 that engage with the inclined part 107 of the housing 100, respectively. The clicks 204 are configured to engage with the inclined part 107 of the housing 100 by inserting the clicks 204 into holes (not illustrated) formed on the inclined part 107 of the housing 100 and rotating the clamps 203. In this way, the side door 102 can close the opening 104 of the housing 100.

When the side door 102 is opened, the power unit PU can be inserted to the housing 100 or can be pulled out of the housing 100.

According to the second embodiment, the housing 100 has the inclined part 107 on an upper end portion of the side part 105 (above the opening 104). Accordingly, without increasing the height of the power conversion device 1, an opening width (frontage size) Hop of the opening part 104 can be increased.

If the inclined part 107 extends in a perpendicular direction to the upper part 106 similarly to the side part 105 (that is, if θ is 180°), the side part 105 lengthens by a length d of the inclined part 107 downward from the upper part 106. In this case, if an opening width Wop of the opening 104 is to be kept large, the height of the power converter 110 needs to be increased. However, there is a limit on the height of a vehicle in many cases, and therefore the height of the power conversion device 1 needs to be as small as possible. In this case, the opening width Wop of the opening 104 is reduced to be narrow.

In contrast, when the inclined part 107 is provided as in the second embodiment, the inclined part 107 substantially extends downward from the upper part 106 by d×sin(θ−90°). Therefore, according to the second embodiment, the opening width Hop of the opening 104 is increased by d−d×sin(θ−90°) as compared to the case where θ is 180°. By increasing the opening width Hop of the opening 104 in this way, the power unit PU can be taken in and out more easily and the work efficiency is improved. Because the length d of the inclined part 107 is kept, the clamps 203 can be attached to the inclined part 107 with no problem.

In the second embodiment, the inclined part 107 is provided between the side part 105 and the upper part 106 of the housing 100 (at an upper end portion of the housing 100). However, the inclined part 107 can alternatively be provided at a lower end portion of the housing 100. That is, the inclined part 107 can be provided between the side part 105 and a bottom part 109 of the housing 100. In this case, the inclined part 207 of the side door 102 is provided on the side of the hooks 201 to correspond to the inclined part 107. Alternatively, the inclined part 107 can be provided on both the upper end portion and the lower end portion of the housing 100. This can also provide the effects of the second embodiment.

(First Modification)

Figures 7A, 7B:
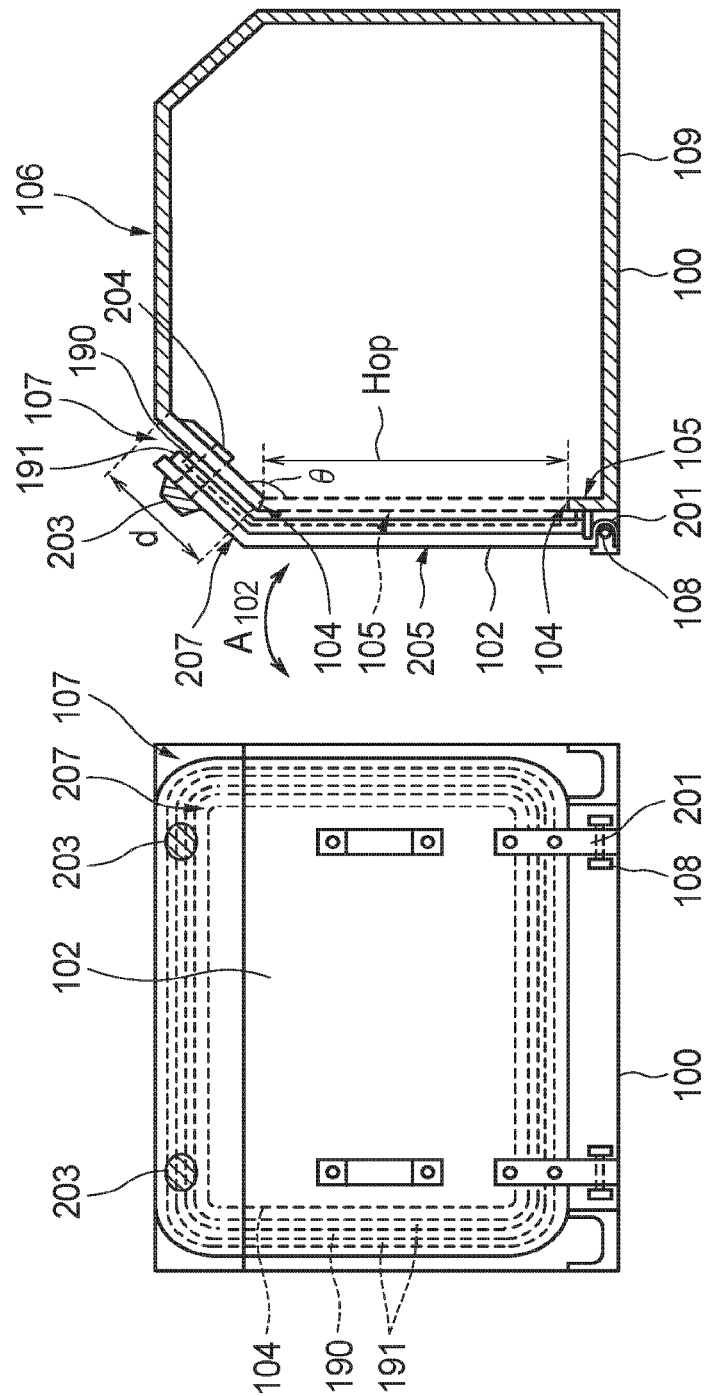
FIGS. 7A-7B are a front view and a side view respectively illustrating an example of a configuration of the housing 100 of the power conversion device 1 according to a first modification of the second embodiment.

FIG. 7(A) is a front view illustrating an example of a configuration of the housing 100 of the power conversion device 1 according to a first modification of the second embodiment. FIG. 7(B) is a side view illustrating the example of the configuration of the housing 100 of the power conversion device 1 according to the first modification of the second embodiment. The housing 100 according to the present modification further includes a flange part 190 provided on the side part 105 and the inclined part 107 to surround the opening 104 of the housing 100, and a waterproof packing part 191 that is provided to be fitted to the flange part 190 and surround the opening 104.

Figure 8:
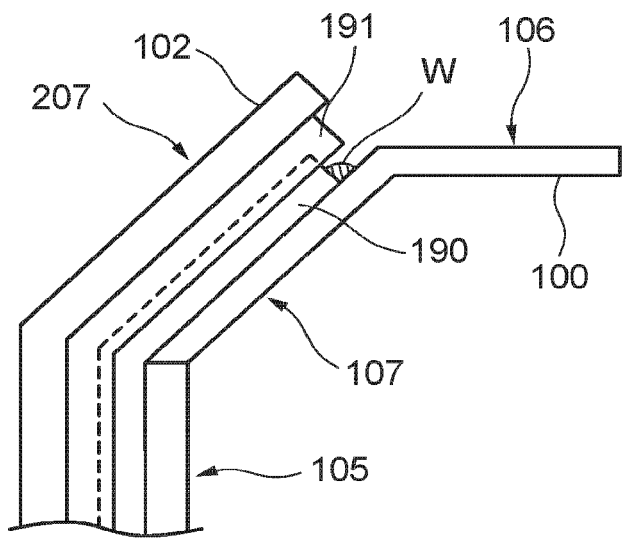
FIG. 8 is a diagram illustrating a state of rainwater being accumulated on a flange part 190 of the housing 100.

The flange part 190 is provided to protrude from the side part 105 and the inclined part 107. The flange part 190 is formed of the same material (metal, for example) as that of the housing 100. The packing part 191 is fitted to an upper portion of the flange part 190 as illustrated in FIG. 8 and does not cover a root of the flange part 190. That is, the packing part 191 is separated from the side part 105 and the inclined part 107 and is not in direct contact therewith. The packing part 191 is formed of a material having elasticity and a waterproof property, such as rubber or silicon resin.

When the side door 102 closes the opening 104 of the housing 100, the packing part 191 seals the opening 104 from outside air in a state sandwiched between the side door 102 and the flange part 190 of the housing 100 and compressed by the clamps 203.

Other configurations of the present modification can be identical to corresponding ones of the second embodiment. Therefore, the present modification can also obtain effects of the second embodiment. Further, the present modification can have the following effects.

FIG. 8 is a diagram illustrating a state of rainwater being accumulated on the flange part 190 of the housing 100. In the present modification, the inclined part 107 is provided on the upper end portion of the housing 100 and the flange part 190 and the packing part 191 are provided also on the inclined part 107. The packing part 191 is fitted to the upper portion of the flange part 190 and does not cover the root of the flange part 190. Accordingly, even when water such as rain flows from above the power conversion device 1, the water is temporarily brought to contact with the packing part 191 and constant contact of remaining water with the packing part 191 does not occur. That is, while water remains at the root of the flange part 190, the water is not in contact with the packing part 191.

If the inclined part 107 is not located at the upper end portion of the housing 100 but extends in a direction substantially perpendicular to the surface of the upper part 106 (that is, if the angle θ in FIG. 6(B) is 180°), there is a risk that water is constantly in contact with the packing part 191.

In contrast thereto, in the present modification, the inclined part 107 is provided and the packing part 191 does not cover the root of the flange part 190. This prevents water accumulated at the root of the flange part 190 from becoming in contact with the packing part 191 and consequently can enhance the waterproof function of the power conversion device 1.

(Second Modification)

Figure 9:
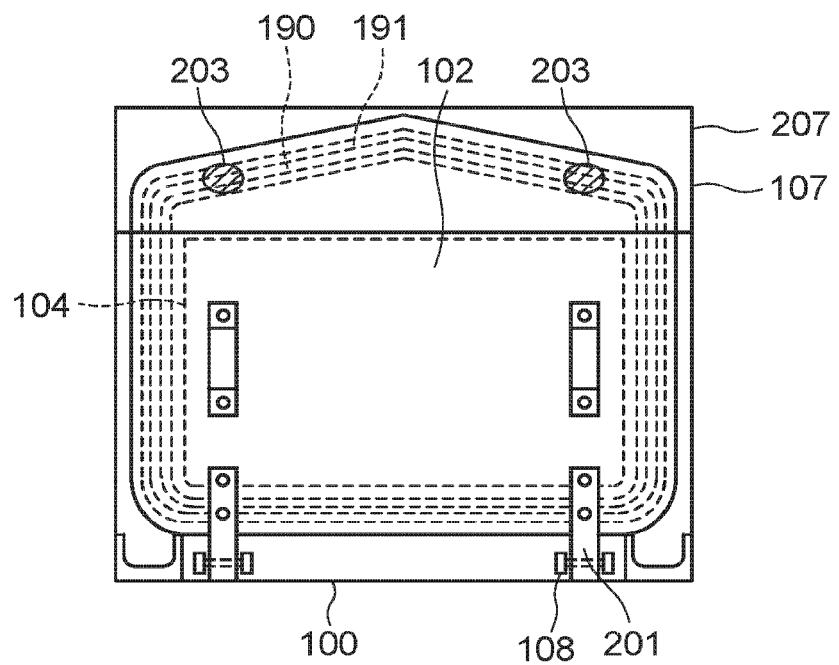
FIG. 9 is a front view illustrating a configuration of the housing 100 of the power conversion device 1 according to a second modification of the second embodiment.

FIG. 9 is a front view illustrating a configuration of the housing 100 of the power conversion device 1 according to a second modification of the second embodiment. In the housing 100 according to the second modification, the flange part 190 and the packing part 191 located on the inclined part 107 (the upper portion of the housing 100) are inclined to descend from a center of the housing 100 (an upper side of the opening 104) toward both end portions thereof. Accordingly, even when water such as rain flows from above the power conversion device 1, the water is less likely to remain at the root of the flange portion 190 and is more likely to flow down to the end portions of the housing 100

(the opening 104). As a result, the waterproof function of the power conversion device 1 is enhanced more.

Upper portions of the flange part 190 and the packing part 191 are respectively formed in a mountain shape having a peak at a central portion of the opening 104 to descend from the peak toward both end portions. However, the flange part 190 and the packing part 191 can be inclined in one direction. That is, the flange part 190 and the packing part 191 can alternatively be formed to have a peak at one end of the housing 100 (the opening 104) and to descend from the peak to the other end.

Third Embodiment

FIGS. 10(A) and 10(B) are diagrams illustrating an example of a configuration of the power conversion device 1 according to a third embodiment. The controller 30 in the power conversion device 1 illustrated in FIG. 1 includes parts such as a monitor 31 seen by an operator at the time of maintenance, and an operation part (not illustrated) operated by the operator. The controller 30 is provided at a different position from that of the power unit PU in the housing 100 and is connected to the power unit PU in the housing 100.

Meanwhile, when the power conversion device 1 is placed on the roof of a vehicle or under the floor thereof, an operator needs to see the monitor 31 of the controller 30 and to be capable of operating the controller 30. Therefore, also a portion that houses the controller 30 in the housing 100 of the power conversion device 1 includes the upper door 101 and the side door 102 explained in the first and second embodiments. Furthermore, it is required that an operator can see the monitor 31 from both the upper door 101 and the side door 102.

Therefore, the power conversion device 1 according to the third embodiment further includes a hinge 300 provided between the controller 30 and the housing 100. One end of the hinge 300 is fixed to a facing surface that faces the side door 102 of the housing 100. The other end of the hinge 300 is fixed to a rear surface of the controller 30, located on the opposite side to a front surface on which the monitor 31 is provided. Accordingly, the controller 30 can rotate on a shaft of the hinge 300 and direct the front surface on which the monitor 31 is located from the side to upward. It is assumed that the monitor 31 of the controller 30 is usually directed toward the side door 102.

When an operator sees the monitor 31 of the controller 30 from the side of the housing 100 as illustrated in FIG. 10(A), the operator opens the side door 102 and can see the monitor 31 without moving the controller 30. This is because the monitor 31 of the controller 30 is directed toward the side door 102 as described above.

When an operator sees the monitor 31 of the controller 30 from above the housing 100 as illustrated in FIG. 10(B), the operator opens the upper door 101 and raises the controller 30. At this time, the controller 30 rotates on the shaft of the hinge 300 to direct the monitor 31 obliquely upward. This enables the operator to easily see the monitor 31.

As described above, according to the third embodiment, provision of the hinge 300 between the controller 30 and the housing 100 enables an operator to easily access the monitor 31 located on the front surface of the controller 30 both from the side and above of the housing 100. As a result, the power conversion device 1 according to the third embodiment can be designed in the same configuration regardless of the placement position in a vehicle of an electric rolling stock and can facilitate an access to the inside.

(First Modification)

Figure 11B:
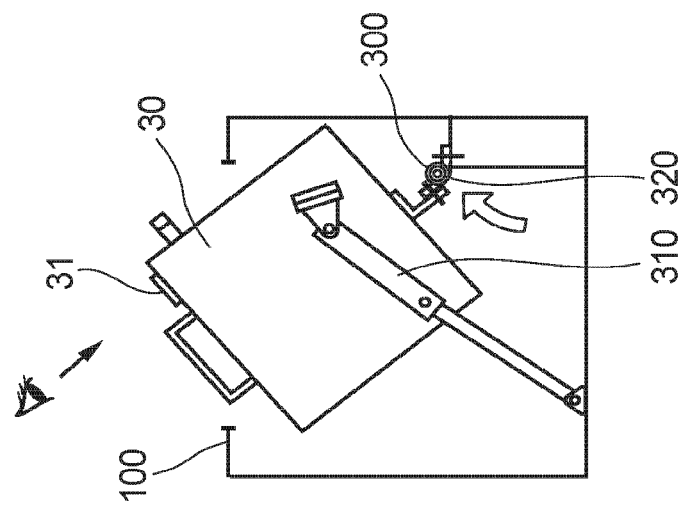
FIGS. 11A-11B are diagrams illustrating an example of a configuration of the power conversion device 1 according to a first modification of the third embodiment.
Figure 11A:
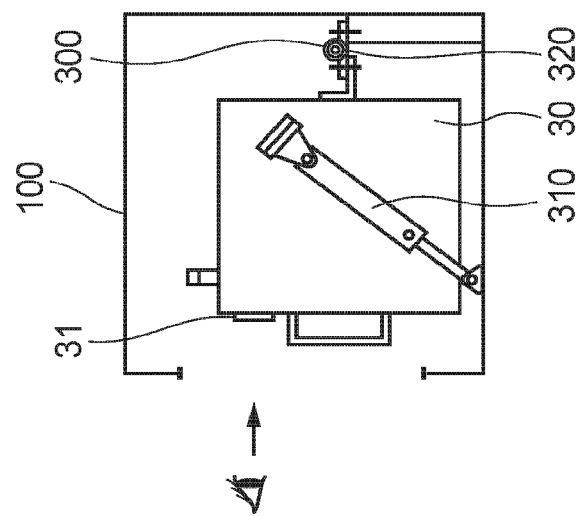

FIGS. 11(A) and 11(B) are diagrams illustrating an example of a configuration of the power conversion device 1 according to a first modification of the third embodiment. The power conversion device 1 according to the present modification further includes a stay part 310 provided between the controller 30 and the housing 100. Other configurations of the present modification can be identical to corresponding ones of the third embodiment.

One end of the stay part 310 is fixed to the bottom surface of the housing 100. The other end of the stay part 310 is fixed to a side surface of the controller 30. The stay part 310 assists an operator when the operator raises the controller 30, and holds (fixes) the controller 30 in a raised state. To hold the controller 30 in a raised state, the stay part 310 has a lock mechanism so as to be locked when extended to a predetermined length.

Accordingly, the controller 30 can be rotated on the shaft of the hinge 300, can be easily raised with the stay part 310, and can easily hold a raised state.

When an operator sees the monitor 31 of the controller 30 from the side of the housing 100 as illustrated in FIG. 11(A), the operator can open the side door 102 and see the monitor 31 without moving the controller 30.

When an operator sees the monitor 31 of the controller 30 from above the housing 100 as illustrated in FIG. 11(B), the operator opens the upper door 101 and raises the controller 30. At this time, the controller 30 rotates on the shaft of the hinge 30 and directs the monitor 31 obliquely upward. Further, the stay part 310 assists the operator and holds the controller 30 in a raised state. Accordingly, the operator can easily see the monitor 31.

In this way, provision of the stay part 310 enables an operator to access the monitor 31 more easily both from the side of the housing 100 and from above.

(Second Modification)

The power conversion device 1 according to a second modification of the third embodiment is further explained with reference to FIGS. 11(A) and 11(B). The power conversion device 1 according to the second modification further includes a spring mechanism 320 provided on the hinge 300. The spring mechanism 320 is provided on the shaft of the hinge 300 and is caused to store energy to apply force in a direction of raising the controller 30. Other configurations of the present modification can be identical to corresponding ones of the first modification of the third embodiment.

Because the spring mechanism 320 applies force in the direction of raising the controller 30, the spring mechanism 320 can assist an operator when the operator raises the controller 30.

Furthermore, when the operator returns the controller 30, the spring mechanism 320 can suppress the controller 30 from rapidly falling. This can reduce the impact on the controller 30 and can safely return the controller 30 to the original position.

Fourth Embodiment

FIG. 12(A) is a front view illustrating an example of a configuration of the power conversion device 1 according to a fourth embodiment. FIG. 12(B) is a side view illustrating the example of the configuration of the power conversion device 1 according to the fourth embodiment.

Circuit devices such as the circuit breaker 40 in the power conversion device 1 illustrated in FIG. 1 are mounted on, for example, a rectangular panel frame 430. The housing 100 of the power conversion device 1 according to the fourth embodiment includes frames 440, 450, and 460 and screws 470 to house and fix a single panel frame 430 or a plurality of panel frames 430. Each of the frames 440, 450, and 460 have a plurality of trenches TR that receive end portions of the panel frame 430 or the panel frames 430. The trenches TR extend in a direction substantially perpendicular to the side door 102. Three out of four sides of the panel frame 430 are fitted into the trenches of the frames 440, 450, and 460, respectively. As illustrated in FIGS. 12(A) and 12(B), the frames 440 and 460 receive both sides extending in parallel to each other of each of the panel frames 430, respectively. The frame 450 receives one of remaining two sides of each of the panel frames 430, which extend in a direction substantially perpendicular to the two sides fitted to the frames 440 and 460. Therefore, the frames 440 and 460 face each other and the frame 450 is placed on one end side of the frames 440 and 460 to extend in a direction substantially perpendicular to the frames 440 and 460. The frames 440 and 450 are fixed to an inner wall of the housing 100 and the frame 460 is configured to be detachable from the frame 450 or the housing 100.

After the panel frames 430 are inserted to the trenches TR of the frames 440, 450, and 460, the screws 470 fasten between the frames 440 and 460 in such a manner that the frames 440 and 460 facing each other sandwich and fix the panel frames 430. The screws 470 are provided at four corners of the frames 440 and 460. Accordingly, the panel frames 430 are fixed in a state fitted in the trenches TR of the frames 440, 450, and 460.

The housing 100 is configured to have the upper door 101 and the side door 102 and to enable an access to the inside from the upper surface and the side surface similarly to that of the first embodiment. When the panel frames 430 are to be inserted from the side door 102 of the housing 100 or the panel frames 430 are to be pulled out therefrom in directions of an arrow As illustrated in FIG. 12(B), an operator opens the side door 102 of the housing 100 and accesses the screws 470 from the side surface side of the housing 100 to loosen the screws 470. The operator then can insert the panel frames 430 in the direction of the arrow As or can pull out the panel frames 430 in the direction of the arrow As.

Meanwhile, when the panel frames 430 are to be inserted from the upper door 101 of the housing 100 or the panel frames 430 are to be pulled out therefrom in directions of an arrow Au illustrated in FIG. 12(B), an operator opens the upper door 101 of the housing 100 and accesses the screws 470 from the upper surface side of the housing 100 to detach the screws 470. The operator further detaches the frame 460. The operator then can insert the panel frames 430 in the direction of the arrow Au or pull out the panel frames 430 in the direction of the arrow Au. At this time, because the trenches TR of the frames 440 and 450 receive the two sides of each of the panel frames 430, the panel frames 430 do not fall down.

As described above, according to the fourth embodiment, one or a plurality of the panel frames 430 are fixed with the frames 440, 450, and 460 and the screws 470. Therefore, an operator can easily access the panel frame 430 or the panel frames 430 both from the side of the housing 100 and from thereabove to take in and out the panel frame 430 or the panel frames 430. As a result, the power conversion device 1 according to the Fourth embodiment can be designed in the same configuration regardless of the placement position in a vehicle of an electric rolling stock and can facilitate an access to the inside.

Furthermore, in the fourth embodiment, the panel frames 430 do not need to be screwed individually in the inner portion of the housing 100 and are fixed collectively with the frames 440, 450, and 460 and the screws 470. Therefore, the number of fasteners such as the screws can be reduced and the reliability and the handling efficiency can be improved. In the fourth embodiment, it suffices that the housing 100 includes a tool space for handling the screws 470 and a tool space for handling other screws can be omitted. Accordingly, the size of the power conversion device 1 can be reduced.

(Modification)

FIG. 13(A) is a front view illustrating an example of a configuration of the power conversion device 1 according to a modification of the fourth embodiment. FIG. 13(B) is a side view illustrating the example of the configuration of the power conversion device 1 according to the modification of the fourth embodiment.

The power conversion device 1 according to the present modification further includes hinges 480 provided between the frame 450 and the frame 460. Other configurations of the present modification can be identical to corresponding ones of the fourth embodiment.

One end of each of the hinges 480 is fixed to the frame 450 placed on a facing surface that faces the side door 102 of the housing 100. The other end of each of the hinges 480 is fixed to the frame 460 provided on the side of the upper door 101 of the housing 100. The frame 460 needs to be detached when the panel frames 430 are to be accessed from the upper door 101 of the housing 100. In the present modification, the frame 460 is physically connected to the frame 450 with the hinges 480 and can rotate on shafts of the hinges 480. Therefore, in the present modification, provision of two screws 470 near the side door 102 suffices and it is unnecessary to provide screws 470 on the side of the facing surface that faces the side door 102 of the housing 100 (in the back of the housing 100). That is, in the present modification, the number of screws 470 can be further reduced from four to two.

As described above, in the present modification, the frame 460 is physically connected to the frame 450 with the hinges 480 and the number of screws 470 can be further reduced. This can improve the reliability and the handling efficiency of the power conversion device 1. Furthermore, the tool space of the housing 100 can be further reduced. Therefore, the size of the power conversion device 1 can be further reduced.

In the present modification, when the panel frames 430 are not fitted to the trenches TR, the frame 460 is inclined because one end of the frame 460 is fixed with the hinges 480. Therefore, an attachment failure in the panel frames 430 can be easily found.

Any two or more of the embodiments and the modifications described above can be combined. For example, when all the first to fourth embodiments are combined, the entire power conversion device 1 illustrated in FIG. 1 can be housed in one housing 100. In this case, a configuration of the entire power conversion device 1 can be designed in the same configuration regardless of the placement position in a vehicle of an electric rolling stock.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A power conversion device that converts power from a power supply and supplies converted power to a load, the device comprising:
   a power converter configured to convert power from the power supply;
   a filter capacitor part configured to eliminate noise from power in the power converter;
   a housing configured to house therein a power unit comprising the filter capacitor part and the power converter stacked on the filter capacitor part and to enable the power unit to be taken in and out from an upper surface and a side surface thereof;
   a guide rail located on a bottom surface of the housing to extend in a direction substantially perpendicular to the side surface and guiding the power unit when the power unit is taken in and out from the side surface of the housing; and
   a protrusion located on the filter capacitor part to fit upward into a hole or a concave portion formed on the power converter and guiding the power converter when the power converter is taken in and out from the upper surface of the housing.

2. The device of claim 1, wherein
   the power converter moves as one unit with the filter capacitor part with the hole or the concave portion being hung on the protrusion when the power unit is to be taken out from the side surface of the housing, and the power converter moves as a separate body from the filter capacitor part with the hole or the concave portion coming off the protrusion when the power unit is to be taken out from the upper surface of the housing.

3. The device of claim 1, wherein
   the guide rail determines a position of the power unit in the housing, and
   the protrusion and the hole or the concave portion determine a position of the power converter on the filter capacitor part.

4. The device of claim 1, further comprising:
   a first connector located on the power unit; and
   a second connector located on a facing surface facing the side surface of the housing, and brought to contact with the first connector when the power unit is inserted along the guide rail.

5. The device of claim 4, further comprising a fixing part configured to fix the power unit while keeping contact between the first contact and the second contact.

6. The device of claim 1, further comprising:
   a panel frame having a circuit breaker configured to interrupt power from the power supply to the power converter mounted thereon; and
   a plurality of frames located in the housing, having trenches receiving sides of the panel, and enabling the panel to be taken in and out along the trenches from the door on the side surface of the housing or the door on the upper surface of the housing.

\* \* \* \* \*